United States Patent
Preuschl

(10) Patent No.: US 9,362,650 B2
(45) Date of Patent: Jun. 7, 2016

(54) ILLUMINATION DEVICE COMPRISING TWO PRINTED CIRCUIT BOARDS

(75) Inventor: Thomas Preuschl, Sinzing (DE)

(73) Assignee: OSRAM GmbH, Munich (DE)

( * ) Notice: Subject to any disclaimer, the term of this patent is extended or adjusted under 35 U.S.C. 154(b) by 846 days.

(21) Appl. No.: 13/128,879

(22) PCT Filed: Oct. 26, 2009

(86) PCT No.: PCT/EP2009/064066
§ 371 (c)(1),
(2), (4) Date: May 12, 2011

(87) PCT Pub. No.: WO2010/054924
PCT Pub. Date: May 20, 2010

(65) Prior Publication Data
US 2011/0222282 A1    Sep. 15, 2011

(30) Foreign Application Priority Data

Nov. 12, 2008 (DE) .......................... 10 2008 056 923

(51) Int. Cl.
*F21S 4/00*        (2006.01)
*H01R 13/422*      (2006.01)
*H05K 3/36*        (2006.01)
*F21K 99/00*       (2016.01)
(Continued)

(52) U.S. Cl.
CPC ............ *H01R 13/422* (2013.01); *F21K 9/1355* (2013.01); *F21K 9/90* (2013.01); *H05K 1/144* (2013.01); *H05K 3/368* (2013.01); *F21Y 2101/02* (2013.01); *H05K 1/056* (2013.01); *H05K 1/141* (2013.01); *H05K 1/147* (2013.01); *H05K 3/3447* (2013.01); *H05K 2201/1059* (2013.01); *H05K 2201/10106* (2013.01); *H05K 2201/10303* (2013.01); *H05K 2203/0195* (2013.01); *Y10T 29/4914* (2015.01); *Y10T 29/49142* (2015.01)

(58) Field of Classification Search
CPC ....................................................... H01R 13/422
USPC ..................................................... 362/249.01
See application file for complete search history.

(56) References Cited

U.S. PATENT DOCUMENTS 3,400,358 A * 9/1968 Byrnes et al. ................... 439/75
4,054,939 A   10/1977 Ammon
(Continued)

FOREIGN PATENT DOCUMENTS

DE       10249575 B3   2/2004
DE    202004012466 U1   2/2005
(Continued)

OTHER PUBLICATIONS

International Search Report of PCT/EP2009/064066 dated Feb. 5, 2010.
(Continued)

*Primary Examiner* — Robert May
*Assistant Examiner* — Bryon T Gyllstrom
(74) *Attorney, Agent, or Firm* — Viering, Jentschura & Partner mbB

(57) ABSTRACT

An illumination device may include at least one light source; and at least two printed circuit boards arranged at least partially one above the other; wherein the at least two circuit boards are connected by means of at least one plug-connection element, with the plug-connection element being embodied on at least one side as a press-fit plug.

11 Claims, 3 Drawing Sheets

(51) Int. Cl.
*F21Y 101/02* (2006.01)
*H05K 1/05* (2006.01)
*H05K 1/14* (2006.01)
*H05K 3/34* (2006.01)

(56) References Cited

U.S. PATENT DOCUMENTS

| | | | |
|---|---|---|---|
| 5,107,408 A * | 4/1992 | Vernondier | 362/238 |
| 6,305,949 B1 | 10/2001 | Okuyama et al. | |
| 6,376,991 B1 | 4/2002 | Sundaram et al. | |
| 7,118,392 B2 * | 10/2006 | Huang | 439/83 |
| 7,121,707 B2 * | 10/2006 | Currie et al. | 362/555 |
| 7,249,981 B2 * | 7/2007 | Chen | H01R 12/585 439/751 |
| 2003/0020627 A1 | 1/2003 | Vukosic | |
| 2003/0148557 A1 * | 8/2003 | Lim et al. | 438/127 |
| 2003/0189829 A1 * | 10/2003 | Shimizu et al. | 362/240 |
| 2006/0098438 A1 * | 5/2006 | Ouderkirk et al. | 362/294 |
| 2007/0184679 A1 * | 8/2007 | Schmid | 439/66 |
| 2008/0013334 A1 * | 1/2008 | Lu | F21K 9/00 362/545 |
| 2008/0050947 A1 * | 2/2008 | Nunokawa | H01R 12/585 439/82 |
| 2011/0199758 A1 * | 8/2011 | Yeh | 362/184 |

FOREIGN PATENT DOCUMENTS

| | | |
|---|---|---|
| DE | 102007037839 A1 | 2/2008 |
| DE | 102006053792 A1 | 5/2008 |
| JP | 2006100052 A | 4/2006 |

OTHER PUBLICATIONS

English abstract of JP 2006100052 A.
English abstract of DE 10249575 B3.
English abstract of DE 102006053792 A1.
English machine translation of DE 20 2004012466 U1.

* cited by examiner

ILLUMINATION DEVICE COMPRISING TWO PRINTED CIRCUIT BOARDS

RELATED APPLICATIONS

The present application is a national stage entry according to 35 U.S.C. §371 of PCT application No.: PCT/EP2009/064066 filed on Oct. 26, 2009, which claims priority from German application No.: 10 2008 056 923.2 filed on Nov. 12, 2008.

TECHNICAL FIELD

Various embodiments relate to an illumination device that includes at least one light source, e.g. at least one light-emitting diode (LED), and at least two printed circuit boards arranged at least partially one above the other and e.g. approximately in parallel. Various embodiments relate also to a method for producing an illumination device of such kind.

BACKGROUND

Illumination devices, in particular those having at least one light-emitting diode (LED), frequently include a plurality of circuit boards on which electronic components needed for operating the illumination device are located. In the case of illumination devices fitted with LEDs, the light-emitting diodes themselves are frequently also located thereupon.

Since in common with other electronic structural elements they can develop a substantial amount of heat during operation, LEDs are located preferably on printed circuit boards that are good thermal conductors such as, for example, metal-core boards, while other structural elements are attached to simple printed circuit boards made of plastic. The printed circuit boards themselves are therein often arranged at least partially one above the other for reasons of space.

What, though, is problematic with said illumination devices is how to electrically connect the printed circuit boards to each other. In the case particularly of metal-core boards a connection is possible practically only using SMD plug connectors or by soldering the cables on directly, which intensifies the production effort and necessitates stocking a large number of structural elements.

SUMMARY

Various embodiments provide an illumination device that includes at least one light source, e.g. at least one light-emitting diode (LED), and at least two printed circuit boards arranged at least partially one above the other and e.g. approximately in parallel, as well as a method for producing an illumination device of such kind by means of which method an electric connection can be established between the printed circuit boards in a simple manner.

A simple possibility of connecting the printed circuit boards to each other in an electrically conducting manner is provided through the at least two printed circuit boards' being connected by means of at least one plug-connection element, with the plug-connection element being embodied on at least one side as a press-fit plug. The press-fit plug can be inserted without a soldered joint into a fitting opening in the region of the printed circuit board, as a result of which it is possible to dispense with soldering. Consequently both a work step will be eliminated and the disadvantages of a soldered joint obviated. Said disadvantages are to be found particularly in the connection's lack of flexibility and its inability to be released as well as in the thermal stress to which the participating and surrounding components are exposed. Low dimensional tolerances in the printed circuit boards' relative mutual positioning can be compensated by the press-fit plug's customary shaping. The invention furthermore makes a compact structural design possible because the plug-connection elements require only little space and complex plugs or cable connections can for example be dispensed with.

It is advantageous for the plug-connection element to have an electrically insulating covering at least in sections on the side facing away from the press-fit plug, in particular to be surrounded virtually all round by the electrically insulating covering. Said side can thereby come into contact with live parts without an electric contact being established therewith. That will be particularly advantageous were the plug-connection element in the region of the second printed circuit board to be in contact with a plurality of live regions because thus defined contact can be established with a specific region.

Through its being the case that at least a first printed circuit board of the at least two printed circuit boards has at least one electrically conducting region extending across substantial areas of the printed circuit board, in particular that at least the first printed circuit board is embodied as a metal-core board, said printed circuit board can be used particularly well for ducting heat away, though also for distributing electric energy or, as the case may be, for wide-area contacting.

At least one circuit board expediently has at least one drilled hole for accommodating the plug-connection element. A particularly simple structure will be achieved thereby because a special retention device or a socket for accommodating the plug-connection element can be dispensed with.

The at least one drilled hole is advantageously embodied for accommodating the press-fit plug. Separate sockets for accommodating the press-fit plug can consequently be dispensed with.

Contacting with the press-fit plug can be performed in a simple manner through its being the case that the drilled hole embodied for accommodating the press-fit plug has at least partially electrically conducting sections. There is no need for separate electric contacts and both a mechanical and an electric connection will be established by means of the plugging operation.

Through its being the case that the at least one drilled hole is embodied for accommodating the plug-connection element's electrically insulating covering it is ensured that said part of the plug connector will be held securely in the accommodating printed circuit board.

The plug-connection element advantageously has at least one solder terminal on the side facing away from the press-fit plug. The side facing away from the press-fit plug can thereby be connected in a simple manner to the associated printed circuit board.

It is advantageous for the electrically insulating covering surrounding the plug-connection element at least in sections on the side facing away from the press-fit plug to have on its side facing away from the press-fit plug a cross-section that is different from that on the side facing the press-fit plug. The plug-connection element can for example thereby be prevented from slipping through the printed circuit board in one direction and equipping of the same thus rendered easier. The plug-connection element can in that way also be prevented from being inserted from the wrong side.

Inserting the plug-connection element too deeply into the printed circuit board accommodating the electrically insulating covering will be obviated if the cross-section of the electrically insulating covering on the side facing away from the press-fit plug is larger than on the side facing the press-fit plug.

The plug element will be prevented from being pushed upward through the circuit board provided for accommodating the electrically insulating covering when the press-fit plug is inserted into the printed circuit board intended for accommodating it if the cross-section of the electrically insulating covering on the side facing the press-fit plug is larger than on the side facing away from the press-fit plug.

It is advantageously possible to realize anti-rotation protection for the plug-connection element through its being the case that the electrically insulating covering has at least in sections a cross-sectional area that is not rotationally symmetric. That will be effective especially when fixing of the plug-connection element in the direction of rotation is achieved on the printed circuit board that accommodates the electrically insulating covering by the shape given to at least a section of the drilled hole and/or a structural element close to the drilled hole. But even without an exactly fitting counterpiece in the region of the circuit board a cross-sectional area that is not rotationally symmetric can be helpful in recognizing and, where necessary, correcting the plug-connection element's orientation.

In a development of the invention it is expedient for the illumination device to have at least one cap and for at least one printed circuit board to be mechanically and electrically connected to the cap. Illumination devices of such kind are intended at least as what are termed retrofit solutions to replace conventional lamps and so are very limited in their spatial extent and have an established shape so that it is especially important to connect the two printed circuit boards in a particularly simple and space-saving manner.

An inventive illumination device can advantageously be produced using a method by which the plug-connection element is in a first step inserted with the part facing away from the press-fit plug into a first printed circuit board and the press-fit plug is inserted in a second step into a drilled hole in a second printed circuit board. That is an especially simple production method because inserting the part facing away from the press-fit plug will enable the plug-connection element to be precisely positioned in the printed circuit board transversally to the plug connection's longitudinal axis with movement simultaneously being allowed in the longitudinal direction, whereas that will not be as readily possible in the case of a press fit because moving the press-fit plug once the press fit has been established will in particular require a substantial expenditure of time and effort and entail risking the printed circuit board's destruction.

It will furthermore be advantageous if preferably between the second and third step the part facing away from the press-fit plug is electrically connected to the first printed circuit board preferably by means of a soldering process, in particular by means of reflow soldering. The two printed circuit boards are at that time still mutually separate, which is why soldering will be easy to perform.

It will furthermore be advantageous when the press-fit plug is inserted into the second printed circuit board for the plug-connection element to be fixed into position on the side facing away from the press-fit plug by means of a stamp. The plug-connection element's slipping out of the first printed circuit board will be reliably obviated thereby without the need for an effort-intensive mechanical securing means for fixing the plug-connection element into position in the first printed circuit board.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced.

Figure 1:
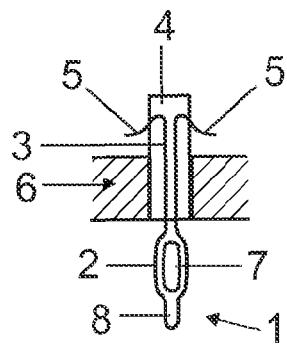
FIG. 1 shows a plug-connection element for an inventive illumination device.

FIG. 1 shows an inventive plug-connection element 1 having a press-fit plug 2 and a pin-shaped part 3 facing away from the press-fit plug 2 and surrounded all round by an electrically insulating covering 4. The polyamide material PA 6 is used as the insulating material for covering the plug-connection element, although persons skilled in the relevant art will also be familiar with other materials depending on the specific requirements.

Secured to the part 3 facing away from the press-fit plug 2 are two connecting wires 5 serving as a solder terminal for electrically contacting the plug-connection element 1 with a first printed circuit board 6. The cylindrical plug-connection element 1 is flattened in the region of the press-fit plug 2, meaning the cross-section narrows in one direction and widens in a direction orthogonal thereto. There is an opening 7 in said flattened part. The press-fit plug 2 terminates at its tip once more in a cylindrical part 8 that is rounded at its end.

Figure 2:
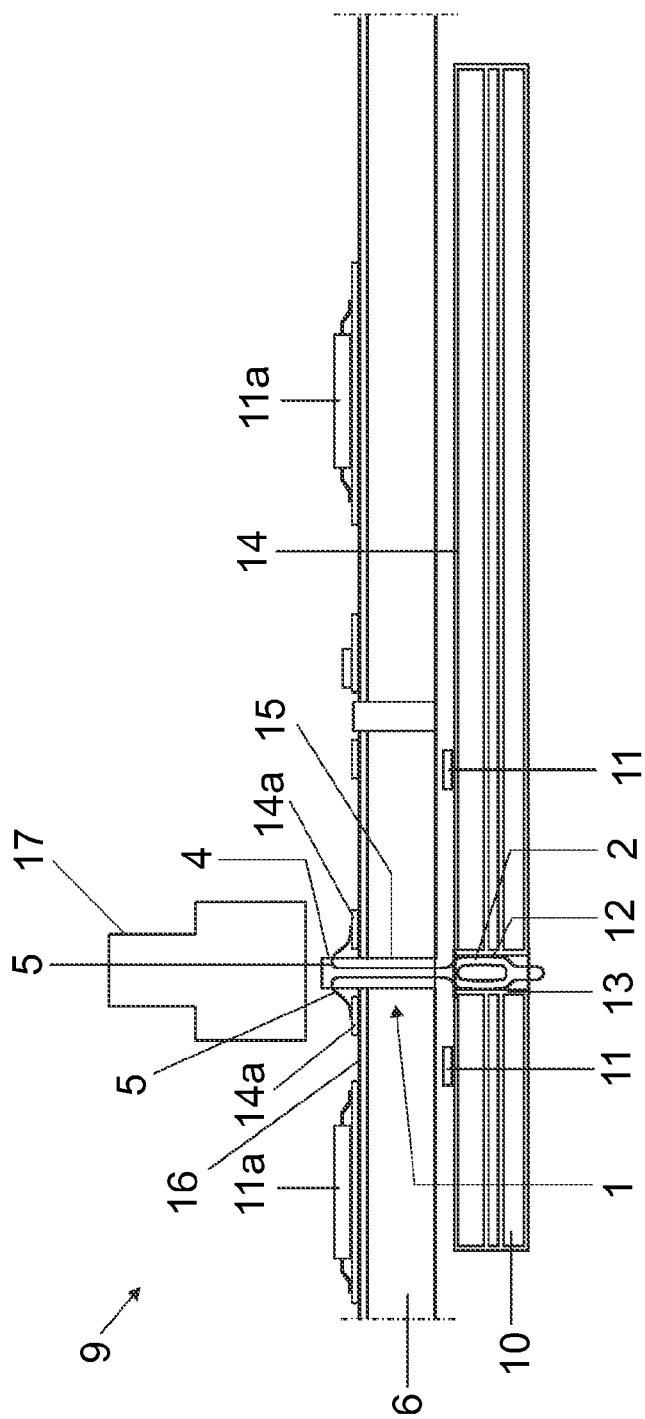
FIG. 2 shows a first inventive illumination device.

An inventive method is employed for inserting the plug-connection element 1 in an inventive illumination device 9, which is illustrated by means of FIG. 2.

In the exemplary embodiment shown in FIG. 2, the illumination device 9 substantially includes a first printed circuit board 6 embodied as a metal-core board 6 and a second printed circuit board 10 embodied as a conventional printed circuit board 10, for example of type FR4. Both printed circuit boards 6, 10 are fitted with electronic components 11, 11a, with the light-emitting diodes 11a of the illumination device 9 being attached to the metal-core board 10 owing to its better thermal conductivity. The components 11, 11a are embodied as SMD structural elements.

The second, conventional printed circuit board 10 is provided with a drilled hole 12 for accommodating the press-fit plug 2, which hole is lined with an electrically conducting material 13. Said material 13 is usually identical to that used for the printed conductors 14, thus preferably being copper or a copper-based alloy, and is electrically connected to at least one printed conductor 14. The lining 13 is preferably attached together with the printed conductors 14.

On the side facing away from the press-fit plug 2, the plug-connection element 1 with the electrically insulating covering 4 is held in a drilled hole 15 and is electrically connected by means of the connecting wires 5 to printed conductors 14a that are in turn located on an electrically insulating layer 16.

The plug-connection element 1 is first inserted into the drilled hole 15 during the production of the illumination device 9 and the connecting wires 5 are connected to the printed conductors 14a by means of, for example, reflow-soldering. The printed conductors 14a have for that purpose been prepared with a surface treatment according to the prior art, for example a chemical tin coating.

The other structural elements 11a can also be soldered as part of the soldering operation. The two printed circuit boards 6, are then put into a suitable position and brought sufficiently close together for the press-fit plug 2 to be inserted into the drilled hole 12. The plug-connection element 1 is therein prevented by means of a stamp 17 from being pushed up and out of the first printed circuit board 6 with the connecting wires 5 being torn off in the process. The printed circuit boards 6, 10 are then fixed mechanically into position by securing means not shown here.

Two more embodiment variants of an inventive plug-connection element 1 are shown in FIG. 3 in the installed condition. The insulating covering has in both embodiment variants a region 18 that has an enlarged cross-section so that the plug-connection element 1 is prevented from slipping through the printed circuit board 6.

Figure 3A:
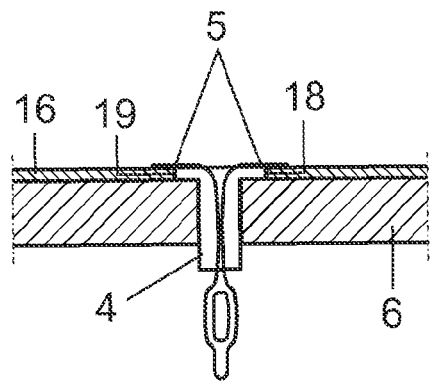
FIG. 3 shows another embodiment variant of a plug-connection element in an inventive illumination device.

In the embodiment variant shown in FIG. 3a, the insulating layer 18 is in the installed condition arranged approximately flat in the insulating layer 16, as a result of which the connecting wires 5 can be led away to the side in a flat manner. That will enable the stamp 17 to be set flat upon the printed circuit board 6 when the illumination device is produced, which will make it easier to correctly position the plug-connection element 1 relative to the printed circuit board 6. Moreover, the plug-connection element 1 does not, in the design that is shown, project substantially beyond the printed circuit board 6, which, for example, will make it easier to attach further components such as reflectors or optical elements onto the circuit board 6 and will not impede the path of the light beam emanating from the light-emitting diodes 11a. The region 18 is furthermore embodied as not being rotationally symmetric. Anti-rotation protection can thus be realized by appropriately shaping the recess 19 in the insulating layer 16 of the circuit board 6. How the recess 19 as well as the region 18 are precisely shaped depends on the requirements placed on anti-rotation security. What are conceivable are, for example, triangular, rectangular, star-shaped, elliptical, or totally irregularly shaped cross-sections, with it also being possible for the cross-sections of the recess 19 and the region 18 to differ, for example a square region 18 in a rectangular recess 19.

Figure 3B:
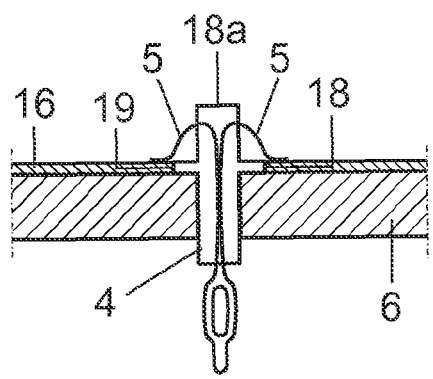

In FIG. 3b the insulating covering is, though, upwardly lengthened in a region 18a so that the connecting wires 5 can be led away to the side and will be protected from damage when the stamp 17 is applied.

FIG. 4 shows two different embodiments of an inventive illumination device 9, each being what are termed retrofit LED lamps 9 that can be used as a replacement for conventional incandescent lamps. Alongside the two printed circuit boards 6, 10 with the light-emitting diodes 11a and the plug-connection elements 1, the illumination device 9 also includes a cap 20 as well as a bulb 21 that both protects the components 6, 10, 11, 11a inside it from damage and environmental influences and prevents live structural elements from being touched, and also offers the user the appearance of a conventional incandescent lamp.

Figure 4A:
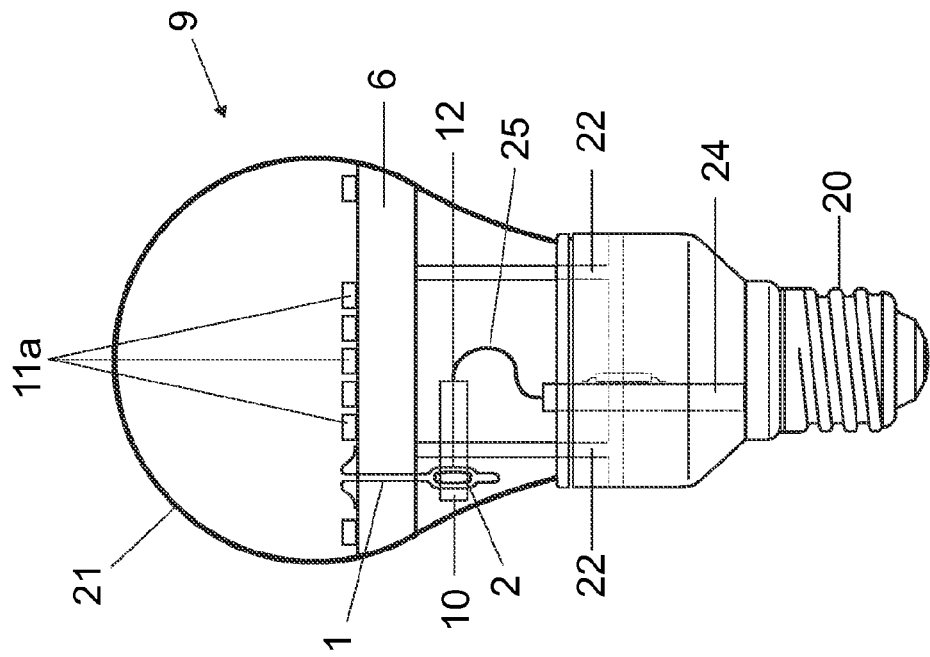
FIG. 4 shows two further embodiment variants of an inventive illumination device.
Figure 4B:
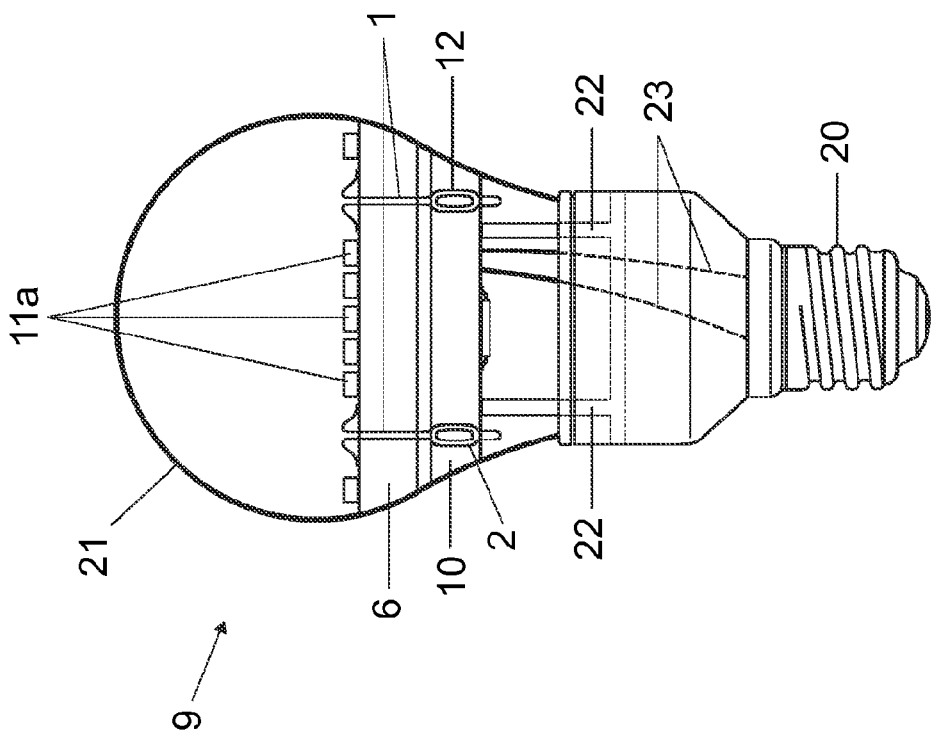

Mechanical securing elements 22 are provided for mounting the printed circuit boards 6, 10, while the electric connection is inventively provided by means of the plug-connection elements 1. The illumination device 9 is hence assembled advantageously such that the conventional printed circuit board 10 is first connected to the cap 20, with that either being done using, as shown in FIG. 4a, a cable connection 23, or, as shown in FIG. 4b, using another conventional printed circuit board 24 joined to the conventional printed circuit board 10 via a connection that is customary for circuit boards 10, 24 of such kind, for example using conventional plug connectors and flat cables. The conventional printed circuit board 10 serves in that exemplary embodiment predominantly to establish contact with the metal-core board 6 by means of the plug-connection element 1.

The metal-core board 6 fitted with plug-connection elements 1 is then, as described above, positioned above the conventional circuit board 10 and the press-fit plugs 2 are inserted into the drilled holes 12 of the conventional printed circuit board 10. The metal-core board 6 is simultaneously fixed into position via the mechanical connection elements 22.

Other embodiment variants of the invention are of course also conceivable instead of the exemplary embodiments shown. Thus, for example, the illumination device 9 can in addition to the components shown in the exemplary embodiments also include other structural elements such as optical elements, cooling bodies, or housings. The embodiment of the plug-connection element 1 can also differ from the variants shown through, for example, the plug-connection element having press-fit plugs 2 on both sides.

It is likewise conceivable for the covering to have a larger cross-section on the side facing the press-fit plug 2 than on the side facing away from it. Alongside the variant shown in the exemplary embodiments with the stepped part of the covering 4, the latter can also have a continuously varying cross-section and thus be embodied as, for example, conical or pyramid-shaped. The cross-section of the plug-connection element 1 is not necessarily round, either, but can assume any other shape, in particular square or hexagonal.

Persons skilled in the relevant art will likewise be familiar with different shapes for the design of the press-fit plug 2, it not necessarily having to have an opening 7. The drilled hole 12 provided for accommodating the press-fit plug 2 can moreover be matched to particular requirements as regards its own shape and the form assumed by its lining. The customary possibilities will be known to persons skilled in the relevant art.

The way the two printed circuit boards 6, 10 are mutually arranged as well as the nature of the printed circuit boards 6, 10 themselves can, of course, differ from the exemplary embodiments shown. In particular, complete overlapping between the printed circuit boards 6, 10, as shown also on the right-hand side in FIG. 4, is unnecessary.

It is possible, moreover, to compensate slight departures from the parallel state by suitably inclining the drilled holes 12, in the printed circuit boards 6, 10.

A multiplicity of methods is known also for the surface treatment of the printed circuit boards 6, 10 and of the printed conductors 14, 14a arranged thereupon, as well as for the possibility of attaching and contacting the structural elements 11, 11a on the circuit boards 14, 14a. That applies also to the contacting of the part 3 of the plug-connection element 1, which part faces away from the press-fit plug 2.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. An illumination device, comprising:
    at least one light source; and
    at least one first and second printed circuit boards arranged at least partially one above the other; wherein the at least one first and second printed circuit boards are connected by means of at least one plug-connection element; wherein the plug-connection element having a first and a second side opposite the first side comprises a press-fit plug on the first side only and a pin-shaped part on the second side, wherein the plug-connection element has an electrically insulating covering at least in sections on the side facing away from the press-fit plug wherein at least one drilled hole is configured to accommodate the electrically insulating covering of the plug-connection element.

2. The illumination device as claimed in claim 1, wherein at least the first printed circuit board has at least one electrically conducting region extending across substantial areas of at least one printed circuit board.

3. The illumination device as claimed in claim 1, wherein at least one printed circuit board has at least one drilled hole for accommodating the plug-connection element.

4. The illumination device as claimed in claim 1, wherein at least one of the printed circuit boards has at least one second hole configured to accommodate the press-fit plug.

5. The illumination device as claimed in claim 4, wherein the at least one second hole configured to accommodate the press-fit plug has at least partially electrically conducting sections.

6. The illumination device as claimed in claim 1, wherein the plug-connection element has at least one solder terminal on the side opposite the press-fit plug.

7. The illumination device as claimed in claim 1, wherein the electrically insulating covering surrounds the plug-connection element at least in sections on the side opposite the press-fit plug and wherein the electrically insulating covering has on a side facing away from the press-fit plug a cross-section that is different from that on the side facing the press-fit plug.

8. The illumination device as claimed in claim 1, wherein the electrically insulating covering has at least in sections a cross-sectional area that is not rotationally symmetric.

9. The illumination device as claimed in claim 1, wherein the illumination device has at least one cap and at least one printed circuit board is mechanically and electrically connected to the cap.

10. A method for producing an illumination device, the illumination device comprising:
    at least one light source;
    at least one first and second printed circuit boards arranged at least partially one above the other;
    wherein the at least two printed circuit boards are connected by means of at least one plug-connection element, wherein the plug-connection element comprises a press-fit plug on a first side only and a pin-shaped part on a second side opposite the first side;
the method comprising:
    inserting the plug-connection element with the part facing away from the press-fit plug into a first printed circuit board; and
    inserting the press-fit plug into a drilled hole in a second printed circuit board wherein when the press-fit plug is inserted into the second printed circuit board the plug-connection element is fixed into position on the side opposite the press-fit plug by means of a stamp.

11. The method as claimed in claim 10, wherein the part belonging to the plug-connection element and opposite the press-fit plug is electrically connected to the first printed circuit board.

* * * * *